(12) United States Patent
Sandhu

(10) Patent No.: US 6,288,590 B1
(45) Date of Patent: Sep. 11, 2001

(54) HIGH VOLTAGE PROTECTION INPUT BUFFER

(75) Inventor: Bal S. Sandhu, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/316,648

(22) Filed: May 21, 1999

(51) Int. Cl.$^7$ ........................................................ H03K 5/08
(52) U.S. Cl. ........................ 327/318; 327/313; 327/314; 326/27; 326/80
(58) Field of Search ........................................ 327/309, 314, 327/313, 318, 319, 320, 321, 325, 328, 108, 112; 361/91.5; 326/26, 27, 80, 81

(56) References Cited

U.S. PATENT DOCUMENTS

| | | | |
|---|---|---|---|
| 4,858,055 | * 8/1989 | Okitaka | 361/91 |
| 5,528,190 | * 6/1996 | Homnigford | 327/328 |
| 5,696,397 | * 12/1997 | Sakai | 257/355 |
| 5,760,630 | * 6/1998 | Okamoto | 327/310 |

OTHER PUBLICATIONS

Pending application No. 09/096,283, filed Jun. 11, 1998, entitled "A Stress–Follower Circuit Configuration".
Pending application No. 09/096,730, filed Jun. 10, 1998, entitled "A Voltage Clamp".

* cited by examiner

Primary Examiner—Terry D. Cunningham
Assistant Examiner—Quan Tra
(74) Attorney, Agent, or Firm—Blakely, Sokoloff, Taylor & Zafman LLP

(57) ABSTRACT

The present invention provides an improved high voltage protection integrated circuit (IC) input buffer. An IC includes a number of circuit elements and an input pin. Each of the circuit elements can tolerate a process dependent maximum voltage magnitude. The input pin can be provided with a voltage magnitude that is larger than the process dependent maximum voltage magnitude of individual circuit elements. The circuit elements include a subset of internal circuit elements and a subset of input buffer circuit elements. The input buffer circuit elements couple the internal circuit elements to the input pin, and are intercoupled in accordance with a predetermined topology to accept the larger voltage magnitude provided to the input pin without damaging the circuit elements.

18 Claims, 2 Drawing Sheets

HIGH VOLTAGE PROTECTION INPUT BUFFER

FIELD OF THE INVENTION

The present invention pertains to the field of integrated circuits. More particularly, the present invention relates to the art of input buffer design to provide a safe maximum input voltage that can be seen across a gate-to-drain or gate-to-source junction of a metal-oxide-semiconductor field effect transistor (MOSFET).

BACKGROUND INFORMATION

Integrated circuits (ICs) are used in a wide variety of electronic equipment including everything from consumer products to space probes. In the vast majority of applications, primary design constraints usually include power dissipation, heat generation, cost, and size. ICs are particularly useful because they can provide millions of transistors in a vary small package. Each transistor, however, dissipates a certain amount of power and generates a certain amount of heat. The potentially millions of transistors in an IC can consume a relatively large amount of power and dissipate a relatively large amount of heat.

In order to conserve power and reduce heat problems in ICs, core IC logic is often designed to operate at relatively low voltage levels. The low internal operating voltages of core logic are often below the normal operating voltages needed by other components. So, for instance, if ICs and other components are used together in electronic equipment, internal logic in an IC may operate at 1.8 volts, but IC input ports may experience signals from external logic of up to 5 volts.

FIG. 1 illustrates one embodiment of a prior art input buffer to convert input signals from external logic 110 to an operating voltage for core logic 120 within IC 130. Transistors 150 and 160 are complementary metal-oxide-semiconductor (CMOS) transistors. When external logic 110 asserts a high voltage, transistor 160 turns on and transistor 150 turns off to couple core logic 120 to ground. When external logic 110 asserts a low voltage, transistor 150 turns on and transistor 160 turns off to couple core logic 120 to core operating voltage source 140. This type of circuit cannot handle high voltage on the gate directly.

If the magnitude of the voltage asserted on the gates of transistors 150 and 160 becomes too large, electric current may arc across the transistors permanently damaging the oxides within the transistors and rendering the transistors inoperative. The maximum voltage that a transistor can withstand across the oxide, either from the gate to the source or the gate to the drain, is process dependent. That is, depending on how thick the oxide is and the profile depth of gate-source junctions and gate-drain junctions for a particular transistor technology or manufacturing process, the maximum tolerable voltage varies.

Because size is often a primary design constraint, with each new generation of integrated circuit technology, transistors within ICs, and hence oxide thicknesses, tend to become smaller and the number of transistors per chip tends to increase. Increased numbers of transistors translates into lower desired operating voltages to reduce heat and power dissipation. Thinner oxides also translate into lower maximum tolerable voltage levels. In which case, with each new generation of IC technology, the difference between internal operating voltages and external operating voltages tends to increase, but the maximum tolerable voltage drop across individual transistor oxides tends to decrease.

Continuing the above example, if the process dependent maximum tolerable voltage for transistors comprising core logic 120 in FIG. 1 was less than the voltage asserted by external logic 110, transistors 150 and 160 would have to be designed to withstand higher voltages than internal logic 120. That is, in order take advantage of an IC technology that uses very small transistors in core logic 120, transistors 150 and 160 would need to be created using a different, higher voltage technology than the internal logic in order to prevent core logic 120 from being permanently damaged by large input voltages.

Unfortunately, each additional technology on an IC tends to add cost. For instance, additional technologies usually require additional, and costly, processing steps to make different oxide thicknesses or carrier electron densities. Additional technologies also tend to make ICs more difficult and costly to design because optimizing performance for one technology may interfere with the performance of other technologies. High voltage technologies, which tend to rely on thicker oxides, also tend to operate slower and dissipate larger amounts of energy and heat.

Therefore, for at least the reasons discussed above, a need exists for an improved integrated circuit input buffer which can withstand a higher input voltage than internal logic, but does not require the addition of a higher voltage transistor technology.

SUMMARY OF THE INVENTION

The present invention provides an improved high voltage protection integrated circuit (IC) input buffer. An IC includes a number of circuit elements and an input pin. Each of the circuit elements can tolerate a process dependent maximum voltage magnitude. The input pin can be provided with a voltage magnitude that is larger than the process dependent maximum voltage magnitude of individual circuit elements. The circuit elements include a subset of internal circuit elements and a subset of input buffer circuit elements. The input buffer circuit elements couple the internal circuit elements to the input pin, and are intercoupled in accordance with a predetermined topology to accept the larger voltage magnitude provided to the input pin without damaging the circuit elements.

BRIEF DESCRIPTION OF THE DRAWINGS

Examples of the present invention are illustrated in the accompanying drawings. The accompanying drawings, however, do not limit the scope of the present invention. Like references in the drawings indicate similar elements.

DETAILED DESCRIPTION

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and circuits have not been described in detail.

The present invention comprises an input buffer within an integrated circuit (IC) which can withstand a higher input voltage than internal logic of the IC, but does not require the addition of a higher voltage transistor technology. The buffer comprises a number of circuit elements which are intercoupled in a predetermined topology. The topology is intended to safely accept a voltage magnitude from external logic that is larger than the process dependent maximum tolerable voltage for individual circuit elements of the IC.

Figure 1:
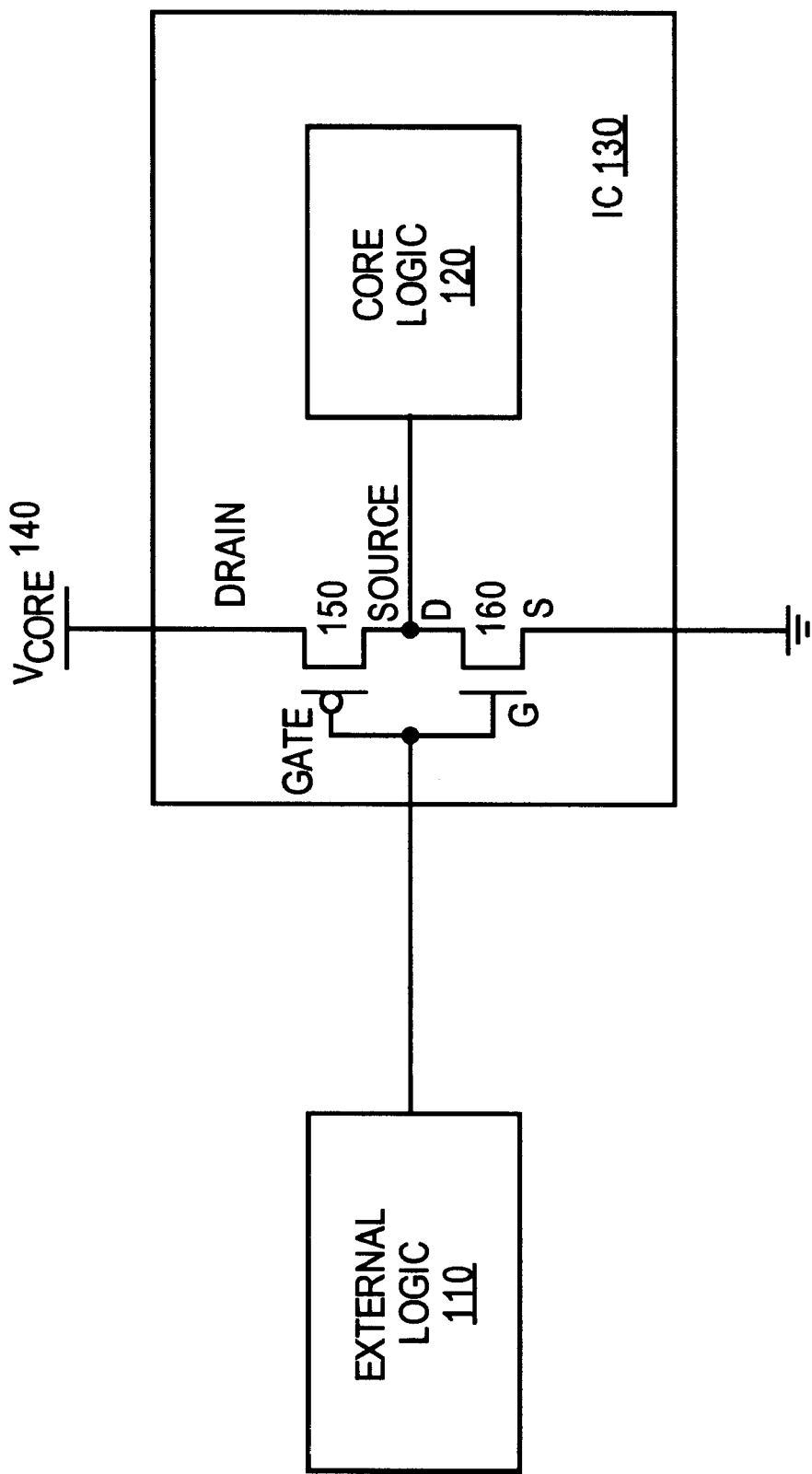
FIG. 1 illustrates one embodiment of a prior art input buffer.
Figure 2:
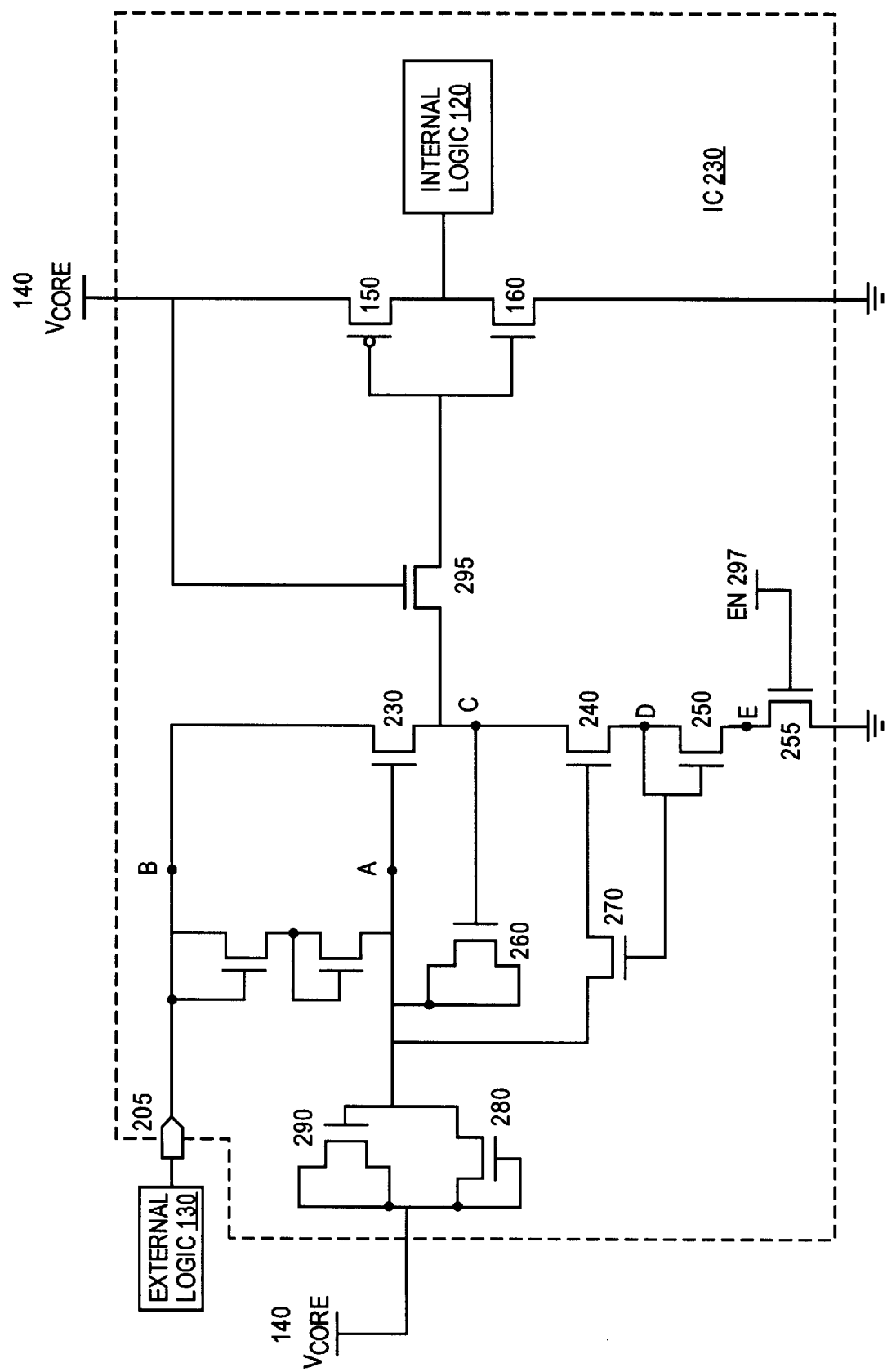
FIG. 2 illustrates one embodiment of the present invention.

FIG. 2 illustrates one embodiment of the present invention. In the illustrated embodiment, IC 230, like IC 130 of FIG. 1, includes internal logic 120 and complementary metal-oxide-semiconductor (CMOS) field effect transistors 150 and 160. IC 230 also includes additional buffer transistors 210 through 295. All of the transistors of IC 230, including those of internal logic 120 (not shown) and transistors 210 through 295, can be designed using the same CMOS technology as transistors 150 and 160. In which case, IC 230 is comprised of only two types of transistors, p-channel and n-channel transistors, all having the same oxide dimensions and hence all having the same process dependent maximum tolerable voltage magnitude across the oxide. By using only two types of transistors throughout IC 230, design and manufacture costs can be reduced.

IC 230 may also be highly integrated, meaning that thousands or even millions of circuit elements are included in the single IC. In order to reduce heat and power dissipated from the potentially millions of transistors in IC 230, its operating voltage is likely to be relatively low when compared to the operating voltage for external logic 130. The process dependent maximum tolerable voltage magnitude is also likely to be relatively low due to small oxide dimensions found in highly integrated ICs.

In any event, under various circumstances, external logic 130 may provide a voltage magnitude at input pin, or pad, 205 that is not only larger than the operating voltage, but larger than the maximum tolerable voltage for the transistors of IC 230. In order to prevent the transistors of IC 230 from being permanently damaged by the excessive voltage magnitudes of external logic 130, buffer transistors 210 through 295 are intercoupled according to a predetermined topology intended to accept the input voltage and provide a safe operating voltage to core logic 120 without damaging any transistors of IC 230.

As an example, the transistors of IC 230 are designed to operate at 1.8 volts and can tolerate a maximum of 2.1 volts across the gate-to-drain or gate-to-source junctions for up to 10 nanoseconds. External logic provides input signals up to 3.3 volts DC, with overshoot transients as high as 1.0 volts, making the input signal go as high as 4.3 volts. The transient duration may exceed 10 nanoseconds. In order to provide a margin of safety, buffer transistors 210 through 295 are coupled so that, given the input characteristic, no more than 2.0 volts appears across the oxide of any one transistor.

As illustrated in FIG. 2, the voltage across the oxide of certain transistors is managed by feeding back gate voltages through other transistors coupled as capacitors or diodes. Transistors 210, 220, 240, 250, and 280 are all coupled as diodes by tying the source and gate together. Since the source and gate are tied together, the voltage difference across the oxide is effectively zero for diode-coupled transistors, eliminating any danger of exceeding the maximum tolerable voltage. Transistors 260 and 290 are coupled as capacitors by tying the source and drain together. Capacitor-coupled transistors do have a voltage across the oxide, so voltage magnitudes across oxides of capacitor-coupled transistors, as well as transistors coupled to three nodes, need to be considered.

Capacitor-coupled transistor 260 provides positive feedback for the gate of transistor 230 to protect against AC noise spikes across the oxide of transistor 230. Capacitor-coupled transistor 290 similarly protects against AC noise from core voltage source 140. DC high voltage protection is provided by diode-coupled transistors 210, 220, 240, and 250 coupled in feedback loops with transistors 230 and 270. Transistor 255 acts as an enable switch that is turned on by the enable signal 297. Transistor 295 similarly acts as a switch to couple the inventive buffer stage, transistors 210 through 290, to the prior art buffer stage, transistors 150 and 160.

In the embodiment of FIG. 2, it is possible to verify that the voltage drop across the oxide of each capacitor-coupled transistor, namely transistors 260 and 290, and each regularly-coupled transistor, namely transistors 230, 255, 270, and 295, is within the safe operating range of up to 2.0 volts for the input voltage characteristic on pad 205 of up to 4.3 volts. It is also possible to verify that the voltage at output 296 is within the safe operating range.

Assuming the threshold voltage to turn on the transistors of IC 230 is approximately 0.65 volts, the voltage drop across a diode-coupled transistor can reach approximately 0.65 volts. Also, since the operating voltage for IC 230 is 1.8 volts, core voltage source 140 provides 1.8 volts. If the voltage on pad 205 is zero at an initial state, enable 297 is on, and core voltage source 140 is providing 1.8 volts, there is a 0.65 volt drop across transistor 280, so node A has an initial voltage of 1.15 volts. Also note that, since capacitor-coupled transistor 290 is in parallel with diode-coupled transistor 280, the maximum voltage drop across transistor 290 is limited by transistor 280 to approximately 0.65 volts. In which case, the oxide of transistor 290 is sufficiently protected.

As the voltage on pad 205 increases to an overshoot of 4.3 volts, the voltage drop from node B to node A is limited by the feedback path through diode-coupled transistors 210 and 220. A 0.65 volt drop across each of transistors 210 and 220 means that the voltage difference seen across the drain-to-gate junction of transistor 230 from node B to node A is limited to approximately 1.3 volts, well below the safe limit of 2.0 volts.

The voltage drop from node A to node C is limited by the feedback path through transistor 260 for AC spikes and transistors 240, 250, 255, and 270 for DC voltages. For instance, when pad 205 is at 4.3 volts, node A is at 3.0 volts and node C is at 1.9 volts due to the combined voltage drops across transistors 240, 250, and 255. So, the maximum voltage drop across the gate-to-source junction of transistor 230 from node A to node C is 1.1 volts. Since capacitor-coupled transistor 260 is in parallel with the voltage drop across the oxide of transistor 230, the voltage drop across the oxide of transistor 260 is also well below the safe limit.

In addition to contributing to the voltage range maintained at node C, diode-coupled transistor 240 also provides protection for the oxide of transistor 270. Since the voltage drop across transistor 240 from node C to node D is limited to approximately 0.65 volts, the oxide of transistor 270 from node C to node D, which is in parallel with transistor 240, is similarly limited, and therefore well protected. The voltage drop across the oxide of transistor 270 from node A to node D is also protected by the limited voltage drop from node A to node C, 1.1 volts as stated above, plus the limited voltage drop from node C to node D, 0.65 volts as stated above, for a total safe voltage drop of 1.75 volts.

Since the voltage at node C reaches a maximum of 1.9 volts, the voltage at node E is limited to something less than 1.9 volts due to the voltage drops across transistors 240 and 250. So, as long as enable signal 297 does not exceed 2.0 volts, the voltage across the oxide of transistor 255 will not exceed the safe limit. Similarly, transistor 295 is coupled to node C and is turned on by core voltage source 140. So, the voltage across the oxide of transistor 295 will not exceed the safe limit as long as core voltage source 140 does not exceed 2.0 volts.

The voltage at output 296 is limited by the maximum voltage at node C. Output 296 reaches a maximum of approximately the core voltage from voltage source 140 minus the threshold voltage for transistor 295.

Those skilled in the art will recognize that the present invention could be designed using any number of transistor types and transistor technologies, including a variety of insulated gate field effect transistors, junction field effect transistors, and bipolar junction transistors. Those skilled in the art will also recognize that the present invention is applicable to any number of ICs, such as memories, digital signal processors, and microprocessors, and that the present invention can be modified to accommodate any number of operating voltages and process dependent maximum tolerable voltage magnitudes. For instance, more or fewer diode-coupled transistors could be added in the feedback path between nodes A and B, and between the node C and ground, of FIG. 2 in order to safely receive larger or smaller voltage ranges on pad 205.

Thus, an improved high voltage protection integrated circuit input buffer is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. An integrated circuit (IC) comprising:
    an input pad; and
    a plurality of circuit elements that tolerate a first process dependent maximum
        voltage magnitude, said plurality of circuit elements comprising internal circuit elements and buffer circuit elements, said buffer circuit elements to couple the input pad to the internal circuit elements, and said buffer circuit elements accepting a second voltage magnitude provided to the input pad that is greater than the first voltage magnitude without damaging the plurality of circuit elements, said buffer circuit elements comprising at least one capacitor-connected transistor and at least one diode-connected transistor coupled with at least one adjacent buffer circuit element, wherein the at least one capacitor connected transistor and the at least one adjacent buffer circuit element are coupled in a feedback arrangement so as to prevent an oxide of said at least one adjacent buffer circuit element from experiencing a voltage above a pre-determined potential.

2. The IC of claim 1 wherein the internal circuit elements are to operate at a third voltage magnitude that is less than the first and second voltage magnitudes.

3. The IC of claim 2 wherein the buffer circuit elements are to provide the third voltage magnitude to the internal circuit elements in response to the second voltage magnitude being provided to the input pad.

4. The IC of claim 1 wherein the plurality of circuit elements comprise at least one of n-channel and p-channel metal-oxide-semiconductor field effect transistors (MOSFET).

5. The IC of claim 1 wherein said at least one capacitor-connected transistor provides AC noise protection to said at least one adjacent buffer circuit element.

6. The IC of claim 1 wherein said at least one diode-connected transistor provides DC noise protection to said at least one adjacent buffer circuit element.

7. An integrated circuit (IC) comprising:
    means for receiving a first voltage magnitude;
    internal circuit means; and
    buffer circuit means for coupling the means for receiving the first voltage magnitude to the internal circuit means, said internal circuit means and buffer circuit means comprising a plurality of circuit elements that tolerate a second process dependent maximum voltage magnitude that is less than the first voltage magnitude, said buffer circuit means comprising a predetermined topology to accept the first voltage magnitude from the means for receiving without damaging the internal circuit means and the buffer circuit means, said buffer circuit means comprising at least one capacitor-connected transistor and at least one diode-connected transistor coupled with at least one adjacent buffer circuit element, wherein the at least one capacitor connected transistor and the at least one adjacent buffer circuit element are coupled in a feedback arrangement so as to prevent an oxide of said at least one adjacent buffer circuit element from experiencing a voltage above a pre-determined potential.

8. The IC of claim 7 wherein the internal circuit means is for operating at a third voltage magnitude that is less than the first and second voltage magnitudes.

9. The IC of claim 8 wherein the buffer circuit means is for providing the third voltage magnitude to the internal circuit means in response to the first voltage magnitude being provided to the means for receiving.

10. The IC of claim 7 wherein the plurality of circuit elements comprise at least one of n-channel and p-channel metal-oxide-semiconductor field effect transistors (MOSFET).

11. The IC of claim 7 wherein said at least one capacitor-connected transistor provides AC noise protection.

12. The IC of claim 7 wherein said at least one diode-connected transistor provides DC noise protection.

13. A system comprising:
    external logic; and
    an integrated circuit, said integrated circuit comprising
        an input pad to couple to the external logic, and
        a plurality of circuit elements that tolerate a first process dependent maximum voltage magnitude, said plurality of circuit elements comprising internal circuit elements and buffer circuit elements, said buffer circuit elements to couple the input pad to the internal circuit elements, and said buffer circuit elements being intercoupled in accordance with a pre-determined topology to accept a second voltage magnitude provided to the input pad by the external logic that is greater than the first voltage magnitude without damaging the plurality of circuit elements, said buffer circuit elements comprising at least one capacitor-connected transistor and at least one diode-connected transistor coupled with at least one adjacent buffer circuit element, wherein the at least one capacitor connected transistor and the at least one adjacent buffer circuit element are coupled in a feedback arrangement so as to help prevent an oxide of said at least one adjacent buffer circuit element from experiencing a voltage above a pre-determined potential.

14. The system of claim 13 wherein the internal circuit elements are to operate at a third voltage magnitude that is less than the first and second voltage magnitudes.

15. The system of claim 14 wherein the buffer circuit elements are to provide the third voltage magnitude to the internal circuit elements in response to the second voltage magnitude being provided to the input pad.

16. The system of claim 13 wherein the plurality of circuit elements comprise at least one of n-channel and p-channel metal-oxide-semiconductor field effect transistors (MOSFET).

17. The IC of claim 13 wherein said at least one capacitor-connected transistor provides AC noise protection to said at least one adjacent buffer circuit element.

18. The IC of claim 13 wherein said at least one diode-connected transistor provides DC noise protection to said at least one adjacent buffer circuit element.

* * * * *